United States Patent

Wada et al.

Patent Number: 5,452,252
Date of Patent: Sep. 19, 1995

[54] SEMICONDUCTOR MEMORY UNIT

[75] Inventors: Atsushi Wada, Ogaki; Yoh Takano, Gifu, both of Japan

[73] Assignee: Sanyo Electric Co., Ltd., Osaka, Japan

[21] Appl. No.: 136,537

[22] Filed: Oct. 14, 1993

[30] Foreign Application Priority Data

Oct. 22, 1992 [JP] Japan .................. 4-309446

[51] Int. Cl.⁶ .............................. G11C 7/00
[52] U.S. Cl. ............... 365/200; 365/230.06; 365/233.5
[58] Field of Search ............... 365/200, 233.5, 230.06, 365/189.07

[56] References Cited

U.S. PATENT DOCUMENTS

| | | | |
|---|---|---|---|
| 4,754,434 | 6/1988 | Wang et al. | 365/200 |
| 5,134,583 | 7/1992 | Matsuo et al. | 365/200 |
| 5,146,429 | 9/1992 | Kawai et al. | 365/200 |
| 5,197,030 | 3/1993 | Akaogi et al. | 365/200 |

FOREIGN PATENT DOCUMENTS 62-46497 2/1987 Japan .
5-144289 6/1993 Japan .

*Primary Examiner*—Do Hyun Yoo
*Attorney, Agent, or Firm*—Sheridan Ross & McIntosh

[57] ABSTRACT

A semiconductor memory unit that includes a regular memory cell array and a redundant column which utilize common rows for actuating regular memory cells when defective memory cells are detected. A first access device designates a column in the regular memory cell array which corresponds to a externally designated column address. A second access device designates a redundant column which corresponds to the externally designated column address. When the regular memory cell array contains defective memory cells and the column addresses of their cells coincide with the externally designated column address, a validating device validates the access to the redundant column by means of the second access device. When the regular memory cell array contains defective memory cells having column addresses other than that designated externally, the validating device validates the access to the column in the regular memory cell array by means of the first access device.

5 Claims, 3 Drawing Sheets

SEMICONDUCTOR MEMORY UNIT

BACKGROUND OF THE INVENTION

1. Field of the Invention

The present invention generally relates to a semiconductor memory unit. More specifically, it relates to a redundant circuit technology used in the semiconductor memory unit.

2. Description of the Related Art

Despite the demand for large capacity highly integrated semiconductor memory units, it is generally difficult to manufacture memory cell arrays containing no faulty bits (i.e., detected faulty memory cells). For example, in using the latest circuit technology to mass produce memory cell arrays, the failure rate of the memory cells in the initially produced lots tends to be very high. This makes the yield rate of effective memories unacceptably low. Since there are usually only a few defective bits for each cell array, it is generally not economical to discard the entire defective array.

The technology for replacing a column and row of a defective memory cell with a spare column and row, prepositioned in the regular memory cell array, is in great demand and consequently widely studied. This technology is generally called redundant circuit technology, and the spare column and row are most often called a redundant column and row. In circumstances where the column and row are replaced in the above-described manner, normal semiconductor memory operations can be carried out, even when the address of a faulty bit coincides with an externally designated memory address provided by means well known to those skilled in the art.

FIG. 3 is a block diagram showing a fundamental circuit diagram of a conventional DRAM (Dynamic Random Access Memory) utilizing redundant columns. The DRAM is primarily constructed with a matrix memory cell array 51 having a minimum data storage unit for each cell 52 of one bit of datum. The array 51 is constructed with memory cells 52 arranged in a two dimensional manner defined by row and column directions. The cells 52 which are arranged in a row are coupled to a word line (hereinafter referred to as WL), while the cells 52 that are arranged in a column are coupled to either a bit line (hereinafter referred to as BL) or to an inverted bit line (hereinafter referred to as bar BL). A pair of bit lines BL, bar BL are arranged to mutually associate with each other and are coupled to a cross couple latch type sense amplifiers 53 (hereinafter referred to as SA). The state of the signal level in each of the paired bit lines BL and bar BL are logical complements of each other.

The memory cell array 51 is divided into two regions: a regular memory cell region 51a and a redundant memory cell region 51b. One set of the paired bit lines BL and bar BL is provided to the redundant memory cell region 51b. A single redundant column includes the cells 52 which are serially coupled to the set of bit lines BL, bar BL, respectively. Each WL is coupled to a row decoder 54. When a row address is externally designated, the row address is transferred to the row decoder 54 through a row address buffer 55 allowing the row decoder 54 to select a WL corresponding to the designated address.

Each SA 53 is coupled to an I/O and bar I/O line through an associated transfer gate 56. The data communicated via the I/O and bar I/O lines is input to a read amplifier 57 (hereinafter referred to as RA) which provides for amplification of the data signals. The RA 57 outputs the amplified signal to an output circuit 58 which outputs data through a data bus (hereinafter referred to as DB) and an inverted data bus (hereinafter referred as bar DB). Output circuit 58 in turn provides output of data to external circuitry (not shown). The logical states of the digital signals communicated by lines I/O and bar I/O, as well as, lines DB and bar DB are the logical complements of each other.

The transfer gates 56, disposed in the regular memory cell region 51a, are coupled to a column decoder 59 through column select lines (hereinafter referred to as CSL). Each of the gates 56 are constructed with a pair of NMOS transistors coupled between the SA 53 and the I/O and bar I/O lines. The gates of the transistor pairs are connected to a column decoder 59 by the CSL. Therefore, when the signal state of the CSL rises to a high level (hereinafter referred to as H level), the transfer gates 26 of the NMOS transistors switch to a conductive ON state.

The conventional redundant memory cell includes the SA 53b coupled to a set of bit lines BL and bar BL in the redundant memory cell region 51b. The redundant memory cell further includes an amplifier SA 53b coupled with a transfer gate 56b. The transfer gate 56b communicates to a redundant column driver 60 through a redundant column select line RCSL. Therefore, when the state of the RCSL rises to a H level, the pair of NMOS transistors comprising the gate 56b are actuated and cause the gate 56b to turn to an ON condition. When a column address is externally designated, the column address is transferred from a column address buffer 61 to the column decoder 59 to provide memory cell address information to address transition detector 62 (hereinafter referred to as ATD) and to spare decoder 63.

The SA amplifiers 53 and 53b amplify the data transferred through the BL and bar BL upon sensing the set of the paired bit lines BL and bar BL which are coupled as a reference to the selected memory cells 52. The ATD 62 detects that a column address has been externally designated, generates a pulse signal ATD1 containing a single pulse, and then outputs it to a column decoder 59, a spare decoder 63, and a delay circuit 64. The delay circuit 64 delays the pulse signal ATD1 by a predetermined length of time, and generates it as a pulse signal ATD2 containing a single pulse. The signal ATD2 is then output from the delay circuit 64 to the column decoder 59 and redundant column driver 60.

Nonvolatile elements such as fuse elements, etc. are disposed in the spare decoder 63 for storing the column addresses of defective memory cells. Manufacturers of DRAM's commonly inspect whether or not a DRAM contains memory cells that are defective in the regular memory cell region 51a just prior their shipment. If the inspected DRAM contains defective memory cells in the memory cell array 52, the manufacturer usually programs the column addresses of the defective cells in the spare decoder 63.

The spare decoder 63 is actuated by the pulse signal ATD1 to read out the column address and compares the stored column address of the defective cells 52 with the externally designated column address. When both column addresses coincide each other, the space decoder 63 generates a redundant signal (hereinafter referred to as RS) which is either at a H or low level (hereinafter referred as to L level). That RS signal is then output to the column decoder 59 and redundant column driver 60.

The column decoder 59 is actuated by the signals RS and ATD2, and in turn selects a column (one set of paired bit lines BL and bar BL) in the array 51 which corresponds to the externally designated column address. The decoder 59 is set to a stand-by condition when initialized with signal RS at either a H or L level, and then becomes actuated when the ATD2 is coupled thereto. The actuated column decoder 59 selects a CSL corresponding to the externally designated column address, and sets the state of CSL to a H level. Therefore, any transfer gates 56 coupled to the CSL are switched to a conductive ON state. As a result, a column corresponding to the externally designated column address in the regular memory cell region 51a is selected through the SA amplifiers 53 via the transfer gates 56.

The redundant driver 60 is likewise actuated by the signals RS and ATD2, and selects a column (one set of paired bit lines BL and bar BL) in the redundant memory cell region 51b. The driver 60 is set to a stand-by condition when initialized with signal RS at either a H or L level, and is subsequently actuated by the input of signal ATD2. The actuated driver 60 sets the state of RCSL to a H level thereby switching transfer gate 56b to an ON condition. In this way, the column in the redundant memory cell 51b is selected by means of the SA 53b and the gate 56b.

The level of the signal RS which sets the driver 60 to an active stand-by condition differs from the signal level required to activate the column decoder 59 to the active stand-by condition. That is, either the column decoder 59 or the redundant column driver 60 is switched to an active stand-by condition depending on whether RS from the spare decoder 63 is at a H or L level. Subsequently, either the decoder 59 or driver 60 is actuated in response to signal ATD2.

The read out operations from the DRAM which is constructed in accordance with the above-described arrangement will now be described.

If the defective memory cells 52 exist in the regular memory cell region 51a, the spare decoder 63 stores the column addresses of the defective cells 52. When data stored in specific addresses in the memory cell array 51 is to be read, a column and a row addresses are first externally designated and then transferred from the row address buffer 55 to the row decoder 54. AWL corresponding to the designated row address is selected by means of the row decoder 54. As the WL is selected, each of the memory cells 52 coupled to the row decoder 54 is selected. The data stored in the cells 52 is then transferred to either the BL or bar BL lines coupled to the cells 52.

When a column address is externally designated, the address is transferred from the column address buffer 61 to the column decoder 59, to ATD 62, and to spare decoder 63. The ATD 62 detects that a column address has been externally designated based on a change in the column address. It next generates a pulse signal ATD1 containing a single pulse, which is output to the spare decoder 63 and the delay circuit 64.

The spare decoder 63 is actuated by pulse signal ATD1, and compares the stored column addresses of the defective memory cells 52 with the externally designated column address. When both column addresses coincide, the spare decoder 63 generates a H level signal RS, and outputs it to the decoder 59 and the driver 60.

When no defective memory cells 52 exist in the regular memory cell region 51a, or when the externally designated column address differs from the column address of the defected memory cells 52, the state of a redundant signal RS is output from the spare decoder 63 at a low level. This low level signal RS sets the driver 59 to an active stand-by condition and prevents the driver 60 from being so set.

The pulse signal ATD1 is also output to circuit 64 where it is delayed by a predetermined length of time. Delay circuit 64 next generates an output pulse signal ATD2 containing only one pulse which is output to the column decoder 59 and to the redundant column driver 60. Since the driver 60 is not in the active stand-by condition, it's condition remains unchanged even though the driver 60 receives signal ATD2. Conversely since the column decoder 59 is set to an active stand-by condition, it will be actuated when it is provided with signal ATD2.

When the decoder 59 is actuated, it first selects the CSL data line corresponding to the externally designated column address, and then sets the selected CSL to a H level. Accordingly, the transfer gate 56 coupled to the CSL is switched to a conductive ON state. In this way, a specific column within the regular memory cell array region 51a is selected by means of the corresponding SA amplifier 53 and the transfer gate 56 in order to provide an address which corresponds to the externally designated column address. That is to say, when a row (i.e., WL) and column (i.e., set of paired bit lines-BL, bar BL) of the memory cell array 51 correspond to the externally designated row and column address, a single memory cell 52 address is selected for the purpose of reading its datum. Using this circuit construction, when signal RS is at a L level, the column decoder 59 is actuated to select the memory cell 52 in the regular memory cell region 51a corresponding to the externally designated column address. The datum stored in the selected cell 52 is then read out.

The data stored in the selected memory cells 52 is transferred from the SA 53 to the I/O and bar I/O lines through the actuated transfer gate 56. The I/O and bar I/O lines input this data to the RA 57 which in turn amplifies and outputs the data signal to output circuit 58 by means of lines DB and bar DB. Output circuit 58 next outputs the amplified datum or data to an external device not shown. If the address stored in the spare decoder 63 is not the same as the externally designated column address, it can be determined that no defective memory cells exist. Under these circumstances, the data stored in the regular memory cell region 51a is accessed in a normal fashion.

Conventional DRAM technology using redundant columns as substitutes for defective memory cells will now be described when a RS signal from the spare decoder 63 is set to a H level.

When signal RS is output from the spare decoder 63 at a H level, the redundant column driver 60 is set to an active stand-by condition. Column decoder 59 is thereby prevented from being set to the active stand-by condition. The delay circuit 64 generates a signal ATD2 in a way similar to that described above, and outputs the signal to the column decoder 59 and the redundant driver 60. Since the driver 60 is set to an active stand-by condition, it will be actuated when coupled with signal ATD2. When actuated, the driver 60 sets the signal of RCSL to a H level. Accordingly, the transfer gate 56b is switched to a conductive ON state. Therefore, the column (i.e., one set of the paired bit lines BL, bar BL) in redundant memory cell 51b is selected via the SA 53b and the transfer gate 56b. This column selection, together with a row selection as described above delineates the selection of a specific redundant memory cell. Only the datum stored in the selected memory cell 52 is transferred from the SA 53b to the I/O and bar I/O lines through the activated transfer gate 56b. This datum is then communicated to external circuitry in a fashion similar to that described above. Thus, given an external designation of a defective memory cell's address, a column in the redundant memory cell region 51b may be selected for use rather than a column in the regular memory cell region 51a.

The reason for providing the delay circuit 64 is to prevent the column decoder 59 and redundant column driver 60 from being simultaneously activated. In the case where the delay circuit 64 is not provided, the column decoder 59 and the redundant driver 60 can be simultaneously activated. When the decoder 59 and the driver 60 are simultaneously actuated, the memory cells 52 in both regular memory region 51a and in the redundant memory cell region 51b are simultaneously selected and information contained therein is transferred to the I/O and bar I/O lines. However, only one bit of datum at any particular time is permitted to be communicated by the I/O and bar I/O lines. Therefore, data simultaneously transmitted through the I/O and bar I/O lines tends to be destroyed. This destruction is commonly referred to as data demolition. As a result, no desired datum is transferred to the RA 57 or subsequently through the output circuit 58 to external circuitry.

To prevent this from occurring, signal ATD1 is delayed by delay circuit 64 for a predetermined length of time, and output as ATD2 after signal RS, based on the externally designated column address, is output from the spare decoder 63. In other words, the delay circuit 64 delays the ATD2 based on the operational cycle of the spare decoder 63 (i.e., the length of time between the activation by the ATD1 and the generation of the RS based on the externally designated column address). As a result, the memory cells 52 in the regular memory cell region 51a and in the redundant memory cell region 51b are not simultaneously selected. Therefore, the data demolition in the I/O and bar I/O is prevented. Unfortunately, the delay circuit 64 increases the length of the access time required for reading out data, and retards the high speed operation for processing the data in the semiconductor device.

The present invention increases circuit performance by having as its primary object to provide a semiconductor memory unit having the simple structure which shorten the length of access time required for reading out data from a memory cell array.

SUMMARY OF THE INVENTION

To achieve the foregoing objects, the present invention includes a regular memory cell array and a redundant column which utilize common rows for actuating regular memory cells when defective memory cells are detected. A first access means designates a column in the regular memory cell array which corresponds to the externally designated column address. A second access means designates a redundant column which corresponds to the externally designated column address. When the regular memory cell array contains defective memory cells and when the column addresses of these cells coincide with the externally designated column addresses, a validating means validates access to the redundant column by means of the second access means. Further, when the regular memory cell array contains defective memory cells and the column addresses of their cells do not coincide with the externally designated column address, the validating means validates the access to the column in the regular memory cell array by means of the first access means.

BRIEF DESCRIPTION OF THE DRAWINGS

The feature of the present invention that are believed to be novel are set forth with particularity in the appended claims. The invention, together with objects and advantages thereof, may be best understood by reference to the following description of the presently preferred embodiments together with the accompanying drawings, in which:

DESCRIPTION OF THE PREFERRED EMBODIMENTS

First Embodiment

Figure 1:
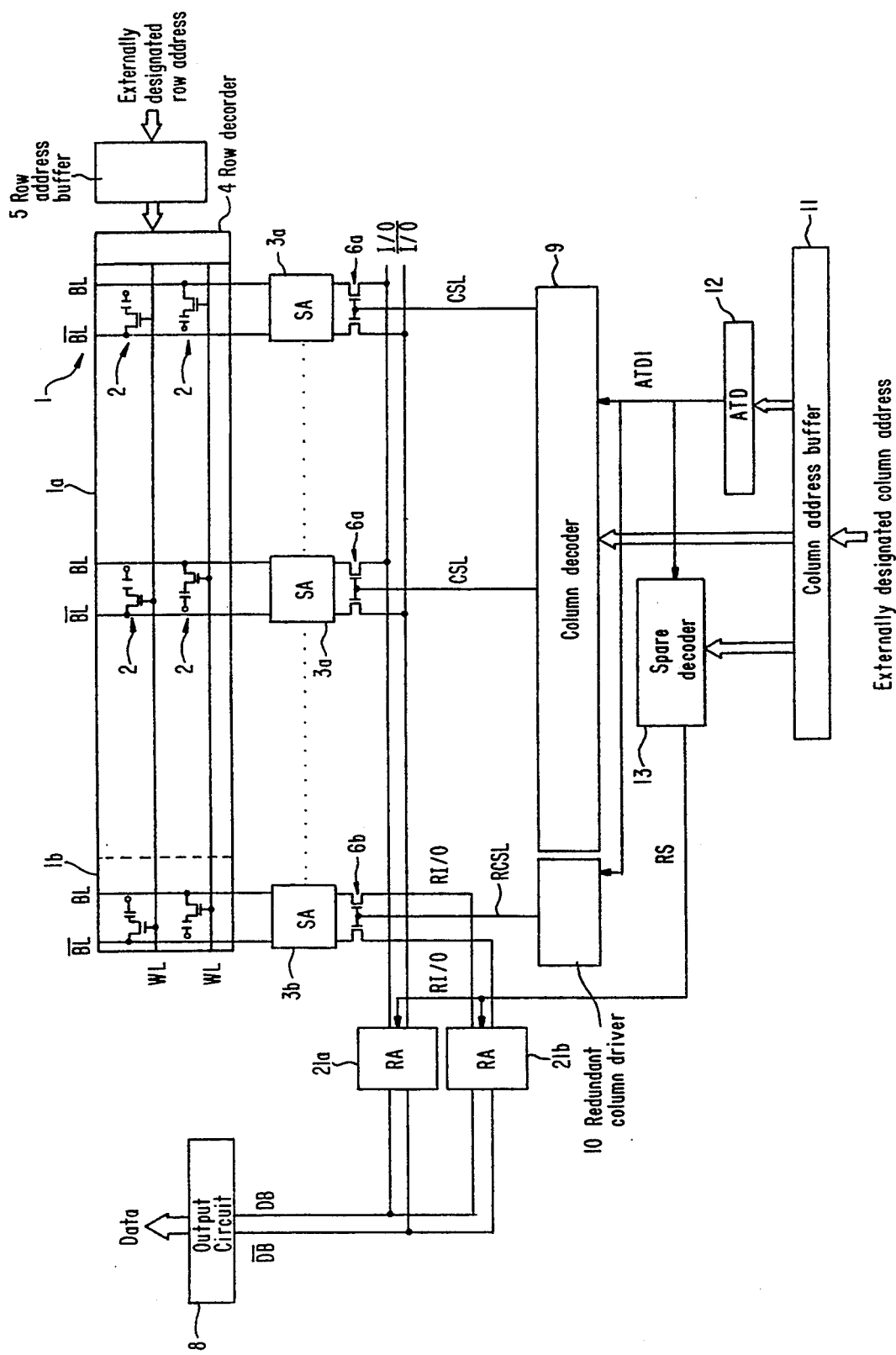
FIG. 1 is a block diagram of DRAM according to the first embodiment of the present invention.

The first embodiment of the present invention embodied in a DRAM will now be described referring to FIG. 1.

The DRAM is primary constructed with matrix memory cell array 1. The memory cell array 1 is constructed with memory cells 2 arranged in two a dimensional manner such as in rows and columns. The cells 2 store one bit of datum which is the minimum unit for memory cell storage. In the memory array 1, the cells 2 are serially arranged along the row direction coupled to a word line, while also being serially arranged along the column direction coupled to a bit line or an inverted bit line respectively. A set of the paired mutually associated bit lines BL and bar BL communicate the datum stored in individual memory cells 2. The logic level of the signal for each set of the paired bit lines BL and bar BL are periodic complements of each other.

The memory cell array 1 is divided into two regions; a regular memory cell region 1a and a redundant memory cell region 1b. One set of the paired bit lines BL and bar BL is provided to the redundant memory cell region 1b. A redundant memory cell column includes the cells 2 which are coupled to the set of paired bit lines BL and bar BL. Each of the wordlines WL is coupled to a row decoder 4. When a row address is externally designated, the row address is transferred to the row decoder 4 through a row address buffer 5. In this way, the row decoder 4 can select a WL corresponding to a memory address designated by external means not shown.

Each set of the paired bit lines BL and bar BL in the regular memory cell region 1a is coupled to a cross couple latch type sense amplifier SA 3a, respectively. Each of the SA amplifiers 3a is coupled to a I/O line and an inverted I/O line through a transfer gate 6a with the I/O and bar I/O lines being coupled to a RA amplifier 21a. The RA 21a is in turn coupled to an output circuit 8 through a data bus DB and an inverted data bus bar DB. The logical state of signals level of I/O and bar I/O lines, and the DB and bar DB lines are periodic complements of each other. Data is output to the external device through the output circuit 8.

The transfer gates 6a are connected to a column decoder 9 through column select lines CSL. Each of the gates 6a is constructed with a pair of NMOS transistors which are coupled between the SA 3a and the I/O and bar I/O lines, respectively. The gates of the pair of transistors are coupled to the column decoder 9 through the CSL. When the CSL are set at a logic H level, the pair of NMOS transistors are actuated, such that the transfer gates 6a switch to a conductive ON condition.

The set of the paired bit lines BL and bar BL in the redundant memory cell region 1b are coupled to a cross couple latch type sense amplifier 3b. The output of the SA 3b is connected to redundant input/output lines RI/O and bar RI/O through a transfer gate 6b. The RI/O and bar RI/O lines are coupled to a RA 21b which is in turn coupled to the output circuit 8 through the DB and bar DB lines. The logic level of the signals provided by line RI/O and bar RI/O line are periodic complements of each other. The transfer gate 6b is coupled to a redundant column driver 10 through a redundant column select line RCSL, and is constructed with a pair of NMOS transistors coupled between the SA 3b and the combination of the RI/O line and the bar RI/O line. Gates of the paired NMOS transistors are coupled to the redundant column driver 10 through the RCSL. When the state of RCSL changes to a H level, the pair of NMOS transistors are actuated with the result that the transfer gate 6b switches to a conductive ON condition.

When a column address is externally designated, the column address is transferred from a column address buffer 11 to the column decoder 9, the ATD 12, and the spare decoder 13. The ATD 12 first detects that a column address has been externally designated based on the change in the column address, then generates a pulse signal ATD1 containing a single pulse, and finally outputs it to the column decoder 9, the redundant column driver 10, and the spare decoder 13.

Nonvolatile elements such as fuse elements, etc. are disposed in the spare decoder 13, which store column addresses of defective memory cells 2. Generally speaking, manufacturers of DRAM inspect whether or not the DRAM contains any defective memory cells 2 in the regular memory cell region 1a prior to the DRAM's shipment. If the DRAM contains any defective cells 2, the manufacturers programs the column addresses of the defective cells 2 in the spare decoder 13.

The spare decoder 13 is activated by pulse signal ATD1 to read out the column address and compares the stored column address of the defective cells 2 with the externally designated column address. When both column addresses coincide each other, the spare decoder 13 generates a redundant signal (RS) the state of which is in a H level. If no column addresses are stored in spare decoder 13 (i.e., due perhaps to the existence of no defective memory cells 2 in the regular memory cell region 1a), or if the address designated by the external device differs from the stored address in spare decoder 13, the decoder 13 generates a L level RS output signal to amplifiers RA 21a and 21b. The RA 21a is activated when a L level RS signal is coupled thereto. On the other hand, the RA 21b is activated when a H level RS signal is coupled thereto.

The column decoder 9 is activated when provided with the pulse signal ATD1, and selects a set of the paired bit lines BL and bar BL which correspond to the externally designated column address. Upon being actuated, column decoder 9 selects a CSL corresponding to the externally designated column address, and sets the state of the CSL to a logic H level. Therefore, any transfer gates coupled to the CSL are switched to a conductive ON condition. As a result, the column corresponding to the externally designated column address in the regular memory cell region 1a is selected using the SA 3a coupled to the transfer gate 6a.

With input of the pulse signal ATD1 to the redundant driver 10, driver 10 is actuated and selects a column (i.e., a set of the paired bit lines BL and bar BL) of the memory cell array 1 in the regular memory cell region 1b. The driver 10 next sets the logic level of the RCSL to a H state, which in turn causes the transfer gate 6b, coupled to the RCSL, to be switched to a conductive ON condition. As a result, a column of the memory array 1 in the redundant memory cell region 1b is selected through the amplifier SA 3b.

The read out operations from the DRAM which is constructed with the above-described arrangement according to the present invention will now be described.

If the defective memory cells 2 exist in the regular memory cell region 1a, the spare decoder 13 stores the column addresses of the defective cells 2. When a datum stored in the specific address in the memory cell array 1 is to be read out, a column and a row addresses are first externally designated, and then, the address is transferred from a row address buffer 5 to the row decoder 4. A WL corresponding to the designated row address is selected by means of the row decoder 4. This in turn, causes each of the memory cells 2, serially coupled to row decoder 4, to be selected. The datum stored in the cell 2 is transferred from cell 2 to amplifiers SA 3a and 3b by means of lines BL or bar BL line.

when a column address is externally designated, the address is transferred from the column address buffer 11 to the ATD 12, the column decoder 9, and the spare decoder 13. The ATD 12 detects that the column address has been externally designated based on the change in the column address, then generates a single pulse signal ATD 1, and finally outputs it to the column decoder 9, the redundant column driver 10 and the space decoder 13. With the input of pulse signal ATD1 to the column decoder 9, the decoder 9 is actuated and selects a CSL line corresponding to the externally designated address which sets the state of the CSLn to a logic H level. The transfer gate 6a, coupled to the CSL, then switches to a conductive ON state. In this way, a column of the memory array 1 (i.e., a set of the paired bit lines BL and bar BL) in the regular memory cell region 1a can be selected that corresponds to an externally designated column address. Thus, one consequence of selecting a row (i.e., WL) and column (i.e., a set of paired bit lines BL and bar BL) in the memory cell array 1, is that one of the memory cells 2 in the regular memory cell region 1a is also properly selected. However, only the datum stored in the selected memory cell 2 is transferred from the SA 3a to the I/O and bar I/O through the actuated transfer gate 6a.

Upon being provided with pulse signal ATD1, the redundant column driver 10 is actuated and sets the logic state of the signal RCSL to a H level. The transfer gate 6b coupled to the RCSL is then switched to a conductive ON state. Consequently, the column of the memory array 1 in the redundant memory cell region 1b (i.e., a set of the paired bit lines BL, bar BL) is selected through the SA amplifier 3b. When a row (i.e., WL) and column in the redundant memory cell region 1b are selected, a specific memory cell 2 in the redundant memory cell region 1b is likewise selected. The datum stored in the selected memory cell 2 is then transferred from the SA 3b to the RI/O and bar RI/O lines through the actuated transfer gate 6b.

The spare decoder 13, actuated when the pulse signal ATD1 is coupled thereto, compares the stored column address of the defective memory cell 2 with the externally designated column address. When both column addresses coincide each other, the spare decoder 13 generates a RS signal set at a H level logic state. When the decoder 13 column has no addresses stored (i.e., no defective memory cells 2 in the regular memory cell region 1a), or when the externally designated address differs from the stored address, the spare decoder 13 generates a L level RS signal. The RS signal is then output to the RA amplifiers 21a and 21b.

When the logic state of a RS signal is set at a L level, the RA amplifier 21a is actuated while RA amplifier 21b remains unactuated. Consequently, datum stored in the memory cells 2 in the regular memory cell region 1a is transferred from the activated RA 21a to the output circuit 8 through the DB and bar DB lines, and then to the external device (not shown). Conversely, the datum (i.e., one of data stored in the memory cells 2 of the redundant memory cell region 1b) transferred to both RI/O and bar RI/O lines is not transferred to the DB and bar DB lines, due to the non-active condition of the RA amplifier 21b. When the state of a RS signal is set to a H level, the RA 21b is actuated while the RA amplifier 21a remains unactuated. Consequently, datum stored in the memory cells 2 in the redundant memory cell region 1b is transferred from the actuated RA 21b to the output circuit 8 through the DB and bar DB lines, and then to the external device (not shown). The data stored in the memory cells 2 of the regular memory cell region 1a, however, will not be transferred to the DB and bar DB lines.

Accordingly, in this embodiment, a pulse signal ATD1 containing a single pulse from the ATD 12 is directly coupled to the column decoder 9 and spare driver 10. Consequently, both decoder 9 and driver 10 are simultaneously activated regardless of the logical state of the RS level. The memory cells 2 in both the regular memory cell region 1a and the redundant memory cell region 1b are simultaneously activated. Whether or not the regular memory cell region 1a contains defective memory cells 2, or whether or not the externally designated column address coincides with the column addresses of defective memory cells 2, both memory cell regions 1a and 1b become simultaneously accessible such that the data stored in both regions 1a and 1b can be read out.

The data read out from the region 1a is transferred to the I/O and bar I/O lines, while the data read out from the region 1b is transferred to the RI/O and bar RI/O lines. The data stored in both selected memory cells 2 are independently transferred without interfering or destroying each other. The spare decoder 13, actuated by the pulse signal ATD1, generates a RS signal based on the externally designated column address. When the state of a RS signal is set to a L level, the amplifier RA 21a is activated while the amplifier RA 21b is not. Therefore, only the data read out from the memory cells 2 in the regular memory cell region 1a are output through the output circuit 8 when signal RS is L. Therefore, when the regular memory cell region 1a contains no defective memory cells 2, or the column address of the defective memory cell 2 does not coincide with the externally designated column address, only the data read out from the memory cells 2 in the memory cell region 1a is output through the output circuit 8.

On the other hand, when the state of a RS signal is set to a H level, the amplifier RA 21b is activated while the amplifier RA 21a is not. In this case, only the data read out from the memory cells 2 in the redundant memory cell region 1b are output through the output circuit 8. That is, when the externally designated column address corresponds with the column address of the defective memory cell 2, only the data read out from the memory cells 2 in the region 1b are output through the output circuit 8. In this way any defective address can be retrieved by selecting a column in the region 1b, rather than selecting the column in the region 1a (i.e., the column of the region 1a is switched with a column of the region 1b). In the operation of writing data into the DRAM, when the externally designated column address coincides with the column address of the defective memory cell 2, the defective address is retrieved similarly to the read out operation previously described.

In this embodiment, the column decoder 9, redundant column driver 10 and spare decoder 13 are simultaneously activated according to a pulse signal ATD1 from the ATD 12. Therefore, the data can be simultaneously read out from the memory cell regions 1a and 1b, respectively. The time required to read the data from the regions 1a and 1b is determined from circuit parameters such as the operational cycles of the column decoder 9, redundant column driver 10, and each of the transfer gates 6a and 6b. During a read out operational time, the spare decoder 13 generates a RS signal based on the externally designated column address. Either one of the RA's 21a or 21b is activated, based on the RS signal, such that either one of the data read out from the regions 1a or 1b is output through the output circuit 8.

Figure 3:
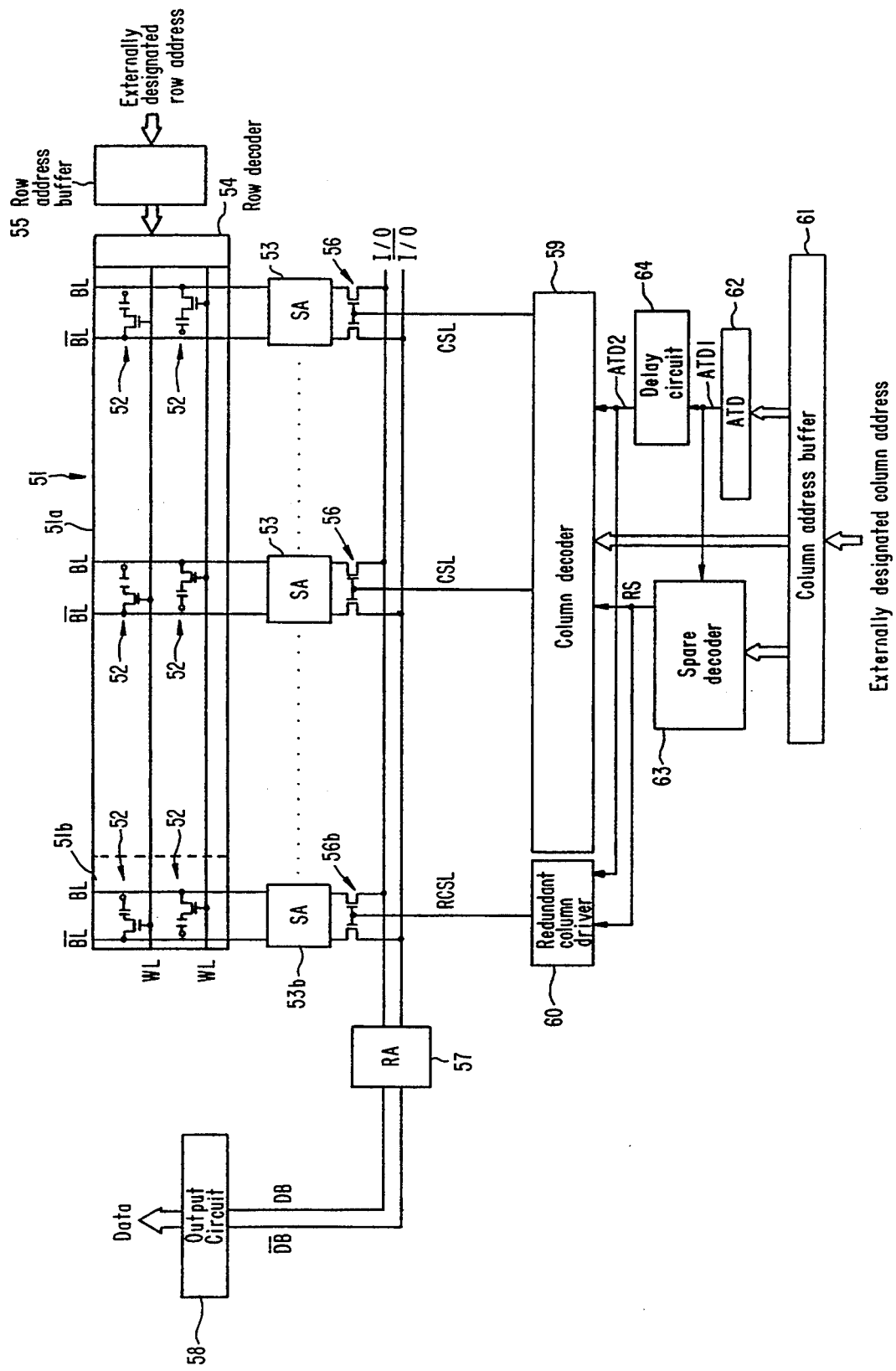
FIG. 3 is a block diagram of conventional DRAM.

In this embodiment, operations of the column decoder 9, redundant column driver 10, each of the transfer gates 6a and 6b are performed simultaneously with respect to the generation of signal RS by the spare decoder 13. On the other hand, in a conventional memory unit shown as shown in FIG. 3, after spare decoder 13 outputs an RS signal based on the externally designated column address, either the column decoder 9 or the redundant driver 10 is activated. Further, in the conventional unit, while the spare decoder 13 is generating a RS signal, other circuit elements (i.e. the column decoder 9, redundant column driver 10, and each of the transfer gates 6a and 6b) are not operated. Therefore, an access time required for reading out memory cell datum can be shortened by the operational time of the spare decoder 13 according to the present invention.

Second Embodiment

Figure 2:
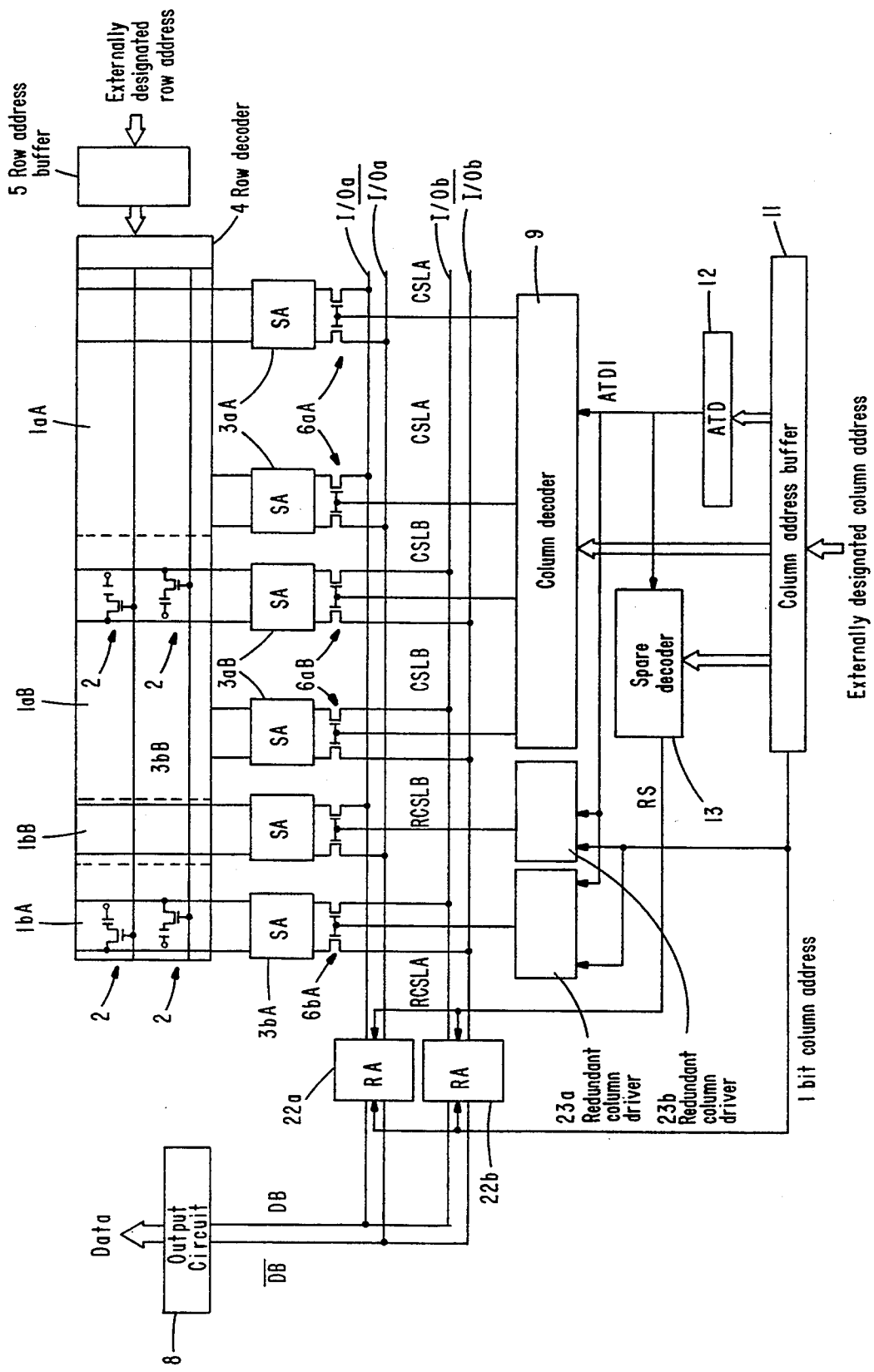
FIG. 2 is a block diagram of DRAM according to the second embodiment of the present invention.

The second embodiment of a DRAM utilizing redundant memory technology according to the present invention will now be described referring to FIG. 2.

In this embodiment, the components similar to those used in the first embodiment are given similar numerical and alphabetical reference marks. A plurality of memory cells 2, representatively illustrated in regions 1aB and 1bA, are included throughout regions 1aA, 1aB, 1bB and 1bA for storing datum within the DRAM. The memory cell array 1 is divided into regular memory cell regions 1aA and 1aB, and redundant memory cell regions 1bA and 1bB. Each of the regions 1bA and 1bB includes a set of paired BL and bar BL lines. A redundant column is formed with the memory cells 2 (i.e., drawing is omitted because similar to the first embodiment) which are serially coupled to the set of paired BL and bar BL lines.

The respective regions 1aA and 1bA, and 1aB and 1bB are mutually associated to retrieve the defective addresses similar to the operations in the first embodiment. When the externally designated column address identifies a column address in the region 1aA that coincides with the defective column address of the memory cell 2, a column in the region 1bA will be selected in place of the column in the region 1aA. When the externally designated column address identifies the column address in the region 1aB that coincides with the defective column address of the memory cell 2, a column in the region 1bB will be selected in place of the column in the region 1aB.

In the DRAM of this embodiment, the memory cell array 1 includes two regular memory cell regions 1aA and 1aB. Each of regions 1aA and 1aB has a single redundant column. The BL and bar BL lines in the regions 1aA, 1aB, 1bA and 1bB are coupled to cross couple type sense amplifiers 3aA, 3aB, 3bA and 3bB, respectively. The SA amplifiers 3aA and 3bB are coupled to I/Oa and bar I/Oa lines through transfer gates 6aA and 6bB, respectively. The SA amplifiers 3aB and 3bA are coupled to transfer gates 6aB and 6bA, respectively. The I/Oa and bar I/Oa are coupled to a RA 22a. The I/Ob and bar I/Ob are coupled to a RA 22b. The RA amplifiers 22a and 22b are coupled to the output circuit 8 through the DB and bar DB, respectively. The logical state of the signal levels in the line pairs of I/Oa and bar I/Oa, I/Ob and bar I/Ob, and DB and bar DB are periodic complements of each other respectively. Data is output from the output circuit 8 to an external device (not shown).

The transfer gates 6aA and 6aB are coupled to the column decoder 9 through column select lines CSLA and CSLB, respectively. Each of the gates 6aA is formed with a pair of NMOS transistors which are coupled between the SA 3aA and the I/O and bar I/O lines. Gates of the paired NMOS transistors are coupled to the column decoder 9 through a single CSLA line. Therefore, when the state of the CSLA is set to a logic H level, the pair of NMOS transistors are actuated, such that the gate 6aA is set to an ON condition. Each of the gates 6aB, formed with a pair of NMOS transistors, are coupled between the SA 3aB and the I/Ob and bar I/Ob lines respectively. Gates of the paired NMOS transistors are coupled to the column decoder 9 through a single CSLB. Therefore, when the state of the CSLB is set to a logic H level, the pair of NMOS transistors are actuated, such that the gate 6aA formed with these activated transistor is set to an ON condition.

Each of the transfer gates 6bA and 6bB are coupled to redundant column drivers 23a and 23b through the redundant column select lines RCSLA and RCSLB respectively. The gate 6bA is formed with a pair of NMOS transistors, coupled between the SA 3bA and the I/Ob and bar I/Ob. Gates of the paired NMOS transistors are coupled to the redundant column driver 23a through the RCSLA. Therefore, when the state of the RCSLA is set at a H level, the pair of NMOS transistors are actuated, such that the gate 6bA are switched to a conductive ON state. The gate 6bB is formed with a pair of NMOS transistors which are coupled between the SA 3bB and the I/Oa and bar I/Oa. The gates of the paired NMOS transistors are coupled to the redundant column driver 23b through the RCSLB. Therefore, when the state of the RCSLB is set to a H level, the pair of NMOS transistors are activated, such that the gate 6bB is switched to a conductive ON state.

When a column address is externally designated, the designated column address is transferred from the column address buffer 11 to the column decoder 9, the ATD 12, the spare decoder 13, and to each of drivers 23a and 23b. However, the externally designated column address transferred to the drivers 23a and 23b is formed with only one address bit which is utilized to designate a memory cell region, either 1aA or 1aB.

The ATD 12 detects that a column address has been externally designated, based on the change in the designated column address and then generates a pulse signal ATD1 containing only one pulse to the column decoder 9, the redundant column drivers 23a and 23b, and to the spare decoder 13. The spare decoder 13 generates a RS signal similar to the first embodiment. The RS signal is then output to RA amplifiers 22a and 22b.

The RA 22a is actuated according to the externally designated column address and the RS signal. If the externally designated column address identifies an address within region 1aA when the state of the RS signal is at a L level, or if the externally designated column address identifies an address within the region 1aB when the state of the RS signal is at a H level, then RA amplifier 22a becomes actuated.

The RA 22b is actuated according to the externally designated column address and the signal RS. This occurs when the amplifier RA 22a remains unactuated. If the externally designated column address identifies an address within the region 1aA when the state of the RS signal is set to a H level, or if the externally designated column address identifies an address within region 1aB when the state of the RS signal is at a L level, then RA amplifier 22b is actuated.

The column decoder 9 is actuated when it receives the input of the pulse signal ATD1. Decoder 9 then selects the column in the memory cell array 1 which corresponds to the externally designated column address. The decoder 9 next selects the CSLA (or the CSLB) which corresponds to the externally designated address, and sets the state of the selected line the CSLA (or the CSLB) to a H level. The gate 6aA (or the 6aB) coupled to the selected line then switches to a conductive ON state. The column in the array 1 corresponding to the externally designated address is thus selected and communicated to the corresponding amplifier SA 3aA (or 3aB).

When the externally designated column address identifies an address in a particular region, as for example region 1aA, pulse signal ATD actuates the driver 23a which selects the designated column of the array 1 in the region of 1bA. In doing this, the driver 23a effectively sets the state of the RCSLA to a logic H level which causes the transfer gate 6bA, coupled to the RCSLA, to switch to an ON condition. This allows for a column of array 1 in the region 1bA to be selected through the SA amplifier 3bA.

Alternatively, when the externally designated column address is within the region 1aB, pulse signal ATD actuates the driver 23b which selects the designated column of the array 1 in the region 1bB. The driver 23b effectively sets the state of the RCSLB to a logic H level which causes the transfer gate 6bB, coupled to the RCSLB, to switch to an ON condition. This allows for a column of array 1 in the region 1bB to be selected through the SA amplifier 3bB.

The read out operations from the DRAM which is constructed with the above-described arrangement according to the present invention will now be described.

When a row address is externally designated, the designated address is transferred from the row address buffer 5 to the row decoder 4 which selects a WL corresponding to the designated row address. The data stored in each of the memory cells 2 at the selected row address is then transferred to either the BL or bar BL lines corresponding to the cells 2. The SA amplifiers 3aA, 3aB, 3bB and 3bA amplify the data transferred to the BL by sensing the set of the paired bit lines BL and bar BL. Using this construction, lines bar BL together with line BL are used for data reference. When a column address is externally designated, the address is transferred from the column address buffer 11 to the column decoder 9, the ATD 12, the spare decoder 13, and the redundant column drivers 23a and 23b.

The externally designated column address is assumed to identify an address within the regular memory cell region 1aA. The ATD 12 detects that the column address has been externally designated, based on the change in the column address, and generates a pulse signal ATD1 containing only one pulse and then outputs it to the column decoder 9, redundant column drivers 23a and 23b, and space decoder 13. The column decoder 9 is activated when a pulse signal ATD1 is provided thereto, and selects a CSLA corresponding to the externally designated address and sets the state of the CSLA to a logic H level. The transfer gate 6aA, coupled to the CSLA, thereby switches to an ON condition. Accordingly, as the row (i.e., WL) and column (i.e., a set of paired bit lines BL, bar BL) corresponding to the externally designated row and column addresses are selected, one of the memory cells 2 in the regular memory cell region 1aA is properly selected.

Only the datum stored in the selected memory cell 2 is transferred from the SA amplifier 3aA to the I/Oa and bar I/Oa lines through the actuated transfer gate 6aA. When the externally designated column address identifies an address within region 1aA, the redundant column driver 23b is not activated. On the other hand, when the pulse signal ATD1 is provided to the column driver 23a, the driver 23a sets the logic state of the RCSLA to a H level thereby allowing the transfer gate 6bA to switch to an ON condition. Accordingly, when a row and column are selected, one of the memory cells 2 in the redundant memory cell region 1bA is properly read. Only the datum stored in the particularly selected cell 2 is transferred from the SA amplifier 3bA to the I/Ob and bar I/Ob through the activated gate 6bA.

The spare decoder 13 is activated when provided with the pulse signal ATD1 and compares the stored column address of the defective memory cell 2 with the externally designated column address. When both column addresses coincide each other, the space decoder 13 generates a H level RS signal. When deffective column addresses are not stored (i.e., no defective memory cells 2 in the regular memory cell region 1a), or the externally designated address differs from the stored address, the spare decoder 13 generates a L level RS signal which is output to the RA amplifiers 22a and 22b. When the RS signal is set at a L level, the RA 22a is actuated but the RA amplifier 22b is not. The datum transferred to both I/Oa and bar I/Oa lines is transferred from the actuated RA 22a to the output circuit 8 through the DB and bar DB lines and then to an external device. Conversely, the datum transferred to both I/Ob and bar I/Ob lines will not be transferred to the DB and bar DB lines, due to the non-active condition of the RA amplifier 22b.

When the state of a RS signal is set at a H level, the RA 22b is activated while the RA 22a is not. Under these conditions, the datum transferred to the I/Ob and bar I/Ob are provided from the actuated RA 22b to the output circuit 8 through the DB and bar DB lines, and then to the external device. On the other hand, the datum transferred by lines I/Oa and bar I/Oa will not be transferred to the DB and bar DB lines, due to the non-active condition of the RA 22a.

When the externally designated column address identifies an address within the regular memory cell region 1aB, then the redundant memory cell region 1bB, as well as the redundant column driver 23b, the SA 3bB, the transfer gates 6bB, the CSLB line, and the RCSLB become functional in place of the above-mentioned components. Accordingly, in this embodiment, the column decoder 9, the redundant column driver 23a (or the driver 23b) and the spare decoder 13 are simultaneously activated with the result that the data stored in the regular memory cell region 1aA (or region 1aB) and the redundant memory cell region 1bA (or region 1bB) are simultaneously read out.

The operational time to read the data from the regions 1aA and 1bA (or the regions 1aB and 1bB) depends on the relative time performance of the individual circuit elements (i.e., cumulative operational time of the column decoder 9, redundant column decoders 23a, 23b, each of the transfer gates 6aA, 6bA, 6aB and 6bB). During the circuit's operational read cycle, the spare decoder 13 generates a RS based on the externally designated column address. Either one of the RA amplifiers 22a or 22b is activated, based on the signal RS, such that either one of the data read out from the regions 1aA and 1bA (or the regions 1aB and 1bB) are output through the output circuit 8.

In this embodiment, operations of the various circuit components are simultaneously carried out with respect to the RS generate operation. Therefore, similar to the first embodiment, an access time required for reading out a datum can be shortened by the operational time of the spare decoder 13 comparing to that of the conventional memory unit.

Although only two embodiments of the present invention have been described herein, it should be apparent to those skilled in the art that the present invention may be embodied in many other specific forms without departing from the spirit or scope of the invention. Particularly, it should be understood that following mode is to be applied. For example, (1) Cross couple latch type sense amplifier is utilized for each of the SA's 3a, 3b, 3aA, 3bA, 3aB, 3bB in the first and second embodiments. Other types such as current mirror type, bipolar type or single end type sense amplifier can be utilized.

(2) NMOS transistors are utilized to form each of transfer gates 6a, 6b, 6aA, 6bA, 6aB, 6bB in the first and second embodiments. PMOS transistors can also be utilized for those gates. When utilizing the PMOS transistors, if the state of each CSL, RCSL, CSLA, CSLB is set to a L level, each of the transfer gates 6a, 6b, 6aA, 6bA, 6aB and 6bB is actuated.

(3) When the level of a redundant signal RS is reversed with respect to those in the first and second embodiments, each of the RA's 21a, 21b, 22a and 22b can be operated.

(4) The regular memory cell regions as well as redundant memory cell regions can be increased to a number greater than that illustrated by the second embodiment.

(5) The sets of paired bit lines BL and bar BL provided to the redundant memory cell regions 1b, 1bA and 1bB may be increased to a number greater than that illustrated in the first or second embodiments.

(6) Similar to the DRAM in the first and second embodiment, SRAM (Static Random Access Memory) or ROM (Read Only Memory) can be utilized.

Therefore, the present examples and embodiments are to be considered as illustrative and not restrictive and the invention is not to be limited to the details given herein, but may be modified within the scope of the appended claims.

What is claimed is:

1. A semiconductor memory unit comprising:
   a regular memory cell array including a plurality of memory cells arranged so as to construct a matrix having a plurality of rows and columns;
   a redundant column including a plurality of memory cells arranged to share said rows in said regular memory cell array;
   a first access means adapted for responding to an externally designated column address for providing access to said columns in said regular memory cell array to designate one of said memory cells therein;
   a second access means for providing access to said redundant column to designate ode of said memory cells therein in response to said externally designated column address; and
   a validating means for validating said access to said redundant column by said second access means when said externally designated column address coincides with a column address of a defective memory cell contained in said regular memory cell array, and for validating said access to said regular memory cell array by said first access means when said externally designated column address does not coincide with said column address of the defective memory cell wherein said validating means includes:
   a first read amplifier for reading data from said memory cell in said regular memory cell array in response to said access to said regular memory cell array by said first access means;
   a second read amplifier for reading data from said memory cell in said redundant column in response to said access to said redundant column by said second access means; and
   an actuating means for actuating said second read amplifier when said externally designated column address coincides with the column address of the defective memory cell contained in said regular memory cell array, and for activating said first read amplifier when said externally designated column address does not coincide with said column address of the defective memory cell.

2. A semiconductor memory unit according to claim 1, wherein said actuating means comprises a spare decoder means having previously stored therein the column address of said defective memory cell, and wherein said spare decoder means compares said column address of said defective memory cell with said externally designated column address, thereby generating an actuation signal to actuate said second read amplifier when both column addresses coincide with each other, and generating an actuation signal to actuate said first read amplifier when both column addresses do not coincide with each other.

3. A semiconductor memory unit according to claim 1, wherein said validating means includes:
   an output circuit receiving said data from said memory cells in said regular memory cell array and said redundant column; and
   data buses for transferring said data between said first and second read amplifiers and said output circuit.

4. A semiconductor memory unit comprising:
   i) a regular memory cell array including a plurality of memory cells arranged so as to construct a matrix with a plurality of rows and columns;
   ii) a plurality of redundant columns each including a plurality of memory cells arranged to share said rows in said regular memory cell array;
   iii) a plurality of sense amplifiers provided for the regular memory cell array, each connected to one of said columns in said regular memory cell array;
   iv) a plurality of transfer gates for said regular memory cell array, each connected to one of said sense amplifiers;
   v) a plurality of column select lines for said regular memory cell array, each connected to one of said transfer gates;
   vi) a column address buffer for temporarily holding an externally designated column address;
   vii) an address transition detector for performing a column address detecting operation by sensing a change of said externally designated column address;
   viii) a column decoder for selecting one of the columns of said regular memory cell array by actuating one of the transfer gates through the column select lines, in response to said column address detecting operation by the address transition detector;
   ix) a plurality of sense amplifiers for said redundant columns, each connected to one of said redundant columns;
   x) a plurality of transfer gates for said redundant columns, each connected to one of the sense amplifiers for said redundant columns;
   xi) a plurality of redundant column select lines, each connected to one of the transfer gates for said redundant columns;
   xii) a redundant column driver for selecting one of said redundant columns by actuating one of the transfer gates for said redundant columns through said redundant column select lines, in response to said column address detecting operation by said address transition detector;
   xiii) a first read amplifier;
   xiv) a second read amplifier;
   xv) an input/output line for said regular memory cell array, for transferring data between each of said transfer gates for said regular memory cell array and said first read amplifier;
   xvi) an input/output line for said redundant columns, for transferring data between each of said transfer gates for said redundant columns and said second read amplifier;
   xvii) a spare decoder means for previously storing a column address of a defective memory cell, and wherein said spare decoder means compares said column address of said defective memory cell, with said column address designated externally, thereby generating an actuation signal to actuate said second read amplifier when both column addresses, coincide with each other, and generating an actuation signal to actuate said first read amplifier when both column addresses do not coincide with each other;

xviii) an output circuit receiving said data from said memory cells in said regular memory cell array and said redundant columns; and data buses for transferring said data between said first and second read amplifiers and said output circuit.

5. A semiconductor memory unit comprising:

a regular memory cell array including a plurality of memory cells arranged so as to construct a matrix having a plurality of rows and columns;

a redundant column including a plurality of memory cells arranged to share said rows in said regular memory cell array;

a first access means adapted for responding to an externally designated column address for providing access to said columns in said regular memory cell array to designate one of said memory cells therein;

a first readout means for communicating a first output signal in response to designation of said one of said memory cells of said regular memory cell array;

a second access means for providing access to said redundant column to designate one of said memory cells therein in response to said externally designated column address;

a second readout means for communicating a second output signal in response to designation of said one of said memory cells in said redundant column;

a validating means, adapted to receive said first output signal and said second output signal, for validating said access to said redundant column by said second access means when said externally designated column address coincides with a column address of a defective memory cell contained in said regular memory cell array, and for validating said access to said regular memory cell array by said first access means when said externally designated column address does not coincide with said column address of said defective memory cell;

wherein said validating means includes;

a first amplifier for receiving said first output signal;

a second amplifier for receiving said second output signal; and an actuating means for actuating said second amplifier when said externally designated column address coincides with the column address of the defective memory cell contained in said regular memory cell array, and for activating said first amplifier when said externally designated column address does not coincide with said column address of said defective memory cell.

* * * * *